(12) United States Patent
Lee et al.

(10) Patent No.: US 10,680,052 B2
(45) Date of Patent: Jun. 9, 2020

(54) DISPLAY AND METHOD OF MANUFACTURING THE SAME

(71) Applicant: Samsung Display Co., Ltd., Yongin-si, Gyeonggi-do (KR)

(72) Inventors: Hyeonbum Lee, Yongin-si (KR); Hyoengki Kim, Yongin-si (KR); Jeongwon Kim, Yongin-si (KR); Kwangwoo Park, Yongin-si (KR); Junhyuk Woo, Yongin-si (KR); Jihwang Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/132,093

(22) Filed: Sep. 14, 2018

(65) Prior Publication Data

US 2019/0189728 A1 Jun. 20, 2019

(30) Foreign Application Priority Data

Dec. 20, 2017 (KR) ........................ 10-2017-0176478

(51) Int. Cl.
*H01L 27/32* (2006.01)
*H01L 51/56* (2006.01)
(Continued)

(52) U.S. Cl.
CPC ........ *H01L 27/3272* (2013.01); *H01L 27/322* (2013.01); *H01L 27/3246* (2013.01); *H01L 51/5253* (2013.01); *H01L 51/5284* (2013.01); *H01L 51/56* (2013.01); *H01L 51/0097* (2013.01); *H01L 2227/323* (2013.01); *H01L 2251/5338* (2013.01); *H01L 2251/558* (2013.01)

(58) Field of Classification Search
None
See application file for complete search history.

(56) References Cited

U.S. PATENT DOCUMENTS 8,044,573 B2 * 10/2011 Kim .................... H01L 51/5284
313/238
9,536,930 B2 1/2017 Sasaki et al.
(Continued)

FOREIGN PATENT DOCUMENTS

JP 2015-050059 A 3/2015
KR 10-2015-0051602 A 5/2015
(Continued)

*Primary Examiner* — Chandra Chaudhari
(74) *Attorney, Agent, or Firm* — Lewis Roca Rothgerber Christie LLP

(57) ABSTRACT

An organic light-emitting display and a method of manufacturing the same are provided. An organic light-emitting display includes: a substrate including a light-emission region and a non-light-emission region around the light-emission region; a display device on the light-emission region of the substrate; and an encapsulation member on the display device. The encapsulation member includes a light-shielding member including a first light-shielding layer and a second light-shielding layer, the first light-shielding layer being in a region corresponding to the non-light-emission region, and the second light-shielding layer being on the first light-shielding layer; and a color conversion member in a region corresponding to the light-emission region.

20 Claims, 9 Drawing Sheets

(51) Int. Cl.
 *H01L 51/52* (2006.01)
 *H01L 51/00* (2006.01)

(56) References Cited

U.S. PATENT DOCUMENTS

2016/0226029 A1    8/2016  Lee et al.
2016/0322444 A1*  11/2016  Kang .................. H01L 27/3272
2017/0054108 A1    2/2017  Kim et al.
2017/0098690 A1*   4/2017  Lee ....................... H01L 27/322

FOREIGN PATENT DOCUMENTS

KR    10-2016-0071581 A    6/2016
KR    10-2016-0095315 A    8/2016

* cited by examiner

DISPLAY AND METHOD OF MANUFACTURING THE SAME

CROSS-REFERENCE TO RELATED PATENT APPLICATION

This application claims priority to and the benefit of Korean Patent Application No. 10-2017-0176478, filed on Dec. 20, 2017 in the Korean Intellectual Property Office, the entire disclosure of which is incorporated herein by reference.

BACKGROUND

1. Field

Aspects of one or more embodiments relate to an organic light-emitting display and a method of manufacturing the same.

2. Description of the Related Art

The market for liquid crystal displays (LCDs), organic light-emitting displays (OLEDs), etc. including thin film transistors (TFTs) is being expanded to displays for use in mobile devices. Such displays for use in mobile devices need to be thin, lightweight, and resistant to breakage. To manufacture thin and lightweight displays, a method of fabricating a display from a glass substrate and then thinning the glass substrate according to a mechanical or chemical method has been introduced instead of a method of using a thin glass substrate. However, this process is complicated, and, further, displays manufactured in this manner are fragile. Therefore, actual use of this process is difficult.

SUMMARY

According to an aspect of one or more embodiments, a display apparatus has a reduced thickness and improved luminescent efficiency.

Additional aspects will be set forth, in part, in the description which follows and, in part, will be apparent from the description, or may be learned by practice of the presented embodiments.

According to one or more embodiments, an organic light-emitting display includes: a substrate including a light-emission region and a non-light-emission region around the light-emission region; a display device on the light-emission region of the substrate; and an encapsulation member on the display device, wherein the encapsulation member includes a light-shielding member including a first light-shielding layer and a second light-shielding layer, the first light-shielding layer being in a region corresponding to the non-light-emission region, and the second light-shielding layer being on the first light-shielding layer; and a color conversion member in a region corresponding to the light-emission region.

The encapsulation member may further include a first protection layer between the display device and the light-shielding member.

The first protection layer may include an inorganic material.

The organic light-emitting display may further include a first liquid repellent pattern between the light-shielding member and the color conversion member; and a second liquid repellent pattern on the second light-shielding layer.

The first liquid repellent pattern may include a hydrophilic material, and the second liquid repellent pattern may include a hydrophobic material.

The organic light-emitting display may further include a second protection layer on the light-shielding member and the color conversion member.

The second protection layer may include an inorganic material.

A width of the first light-shielding layer may be greater than a width of the second light-shielding layer, and a thickness of the second light-shielding layer may be greater than a thickness of the first light-shielding layer.

The second light-shielding layer may be located outside an opening formed in the first light-shielding layer, the opening corresponding to the light-emission region.

According to one or more embodiments, an organic light-emitting display includes: a substrate; a first electrode on the substrate; a first insulating film covering an edge of the first electrode; an intermediate layer on the first electrode and including an emission layer; a second electrode covering the intermediate layer and facing the first electrode; a second insulating layer covering the second electrode; a light-shielding member including a first light-shielding layer and a second light-shielding layer, the first light-shielding layer being on the second insulating layer and having a first opening through which a portion of the second insulating layer corresponding to the emission layer is exposed, and the second light-shielding layer being on the first light-shielding layer and having a second opening through which the first opening and an edge of the first light-shielding layer are exposed; and a color conversion member within the first and second openings.

The organic light-emitting display may further include a first liquid repellent pattern on respective lateral surfaces of the first and second openings; and a second liquid repellent pattern on the second light-shielding layer.

The first liquid repellent pattern may include a hydrophilic material, and the second liquid repellent pattern may include a hydrophobic material.

The organic light-emitting display may further include a third insulating layer on the light-shielding member and the color conversion member.

The third insulating layer may include an inorganic material.

A width of the first light-shielding layer may be greater than a width of the second light-shielding layer, and a thickness of the second light-shielding layer may be greater than a thickness of the first light-shielding layer.

According to one or more embodiments, a method of manufacturing an organic light-emitting display includes: providing a substrate including a light-emission region and a non-light-emission region around the light-emission region; forming a display device on the light-emission region of the substrate; forming a first protection layer covering the display device; forming a light-shielding member on the first protection layer, the light-shielding member including a first light-shielding layer and a second light-shielding layer, wherein the first light-shielding layer is in a region corresponding to the non-light-emission region, and the second light-shielding layer is on the first light-shielding layer; and forming a color conversion member in a region corresponding to the light-emission region, wherein the color conversion member is formed on the first light-shielding layer.

The method may further include, after the forming of the light-shielding member, forming a first liquid repellent pattern on respective lateral surfaces of the first and second light-shielding layers; and forming a second liquid repellent pattern on the second light-shielding layer.

The forming of the light-shielding member may include forming the first light-shielding layer on the first protection layer, the first light-shielding layer including a first opening through which a portion of the first protection layer corresponding to the light-emission region is exposed; and forming the second light-shielding layer outside the first opening of the first light-shielding layer, the second light-shielding layer including a second opening through which an edge of the first light-shielding layer is exposed.

The method may further include forming a third insulating layer on the light-shielding member and the color conversion member.

A width of the first light-shielding layer may be greater than a width of the second light-shielding layer, and a thickness of the second light-shielding layer may be greater than a thickness of the first light-shielding layer.

BRIEF DESCRIPTION OF THE DRAWINGS

The above and/or other aspects will become apparent and more readily appreciated from the following description of some embodiments, taken in conjunction with the accompanying drawings in which.

DETAILED DESCRIPTION

Figure 1A:
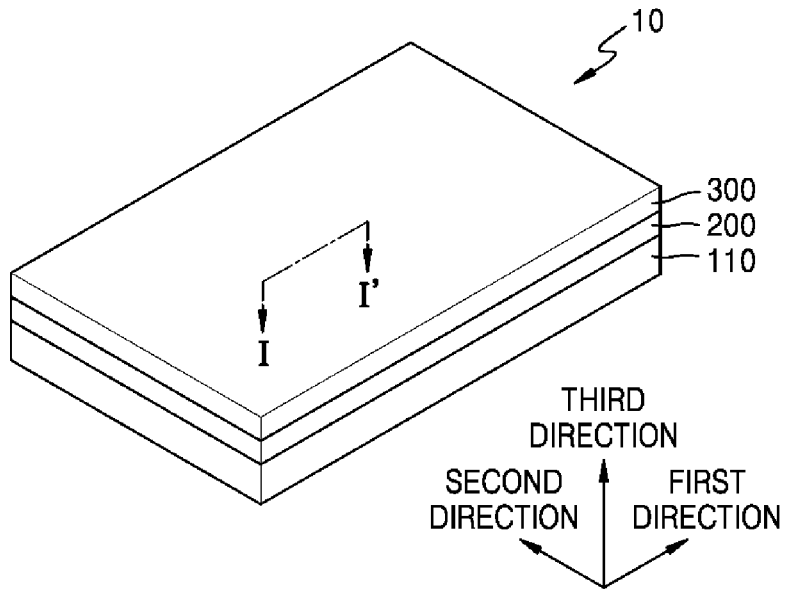
FIG. 1A is a perspective view of a display according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present invention allows for various changes and numerous embodiments, particular embodiments will be illustrated in the drawings and described in further detail in the written description. Herein, effects and features of the present invention and a method for accomplishing them will be described more fully with reference to the accompanying drawings, in which some embodiments of the invention are shown. The present invention may, however, be embodied in many different forms and should not be construed as limited to the embodiments set forth herein.

It is to be understood that although the terms "first," "second," etc. may be used herein to describe various components, these components should not be limited by these terms. These terms are used to distinguish one component from another.

As used herein, the singular forms "a," "an," and "the" are intended to include the plural forms as well, unless the context clearly indicates otherwise.

It is to be further understood that the terms "comprises" and/or "comprising," as used herein, specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

One or more embodiments of the invention will be described below in further detail with reference to the accompanying drawings. Those components that are the same or are in correspondence may be rendered the same reference numeral in various drawings, and redundant descriptions may be omitted.

Figure 1B:
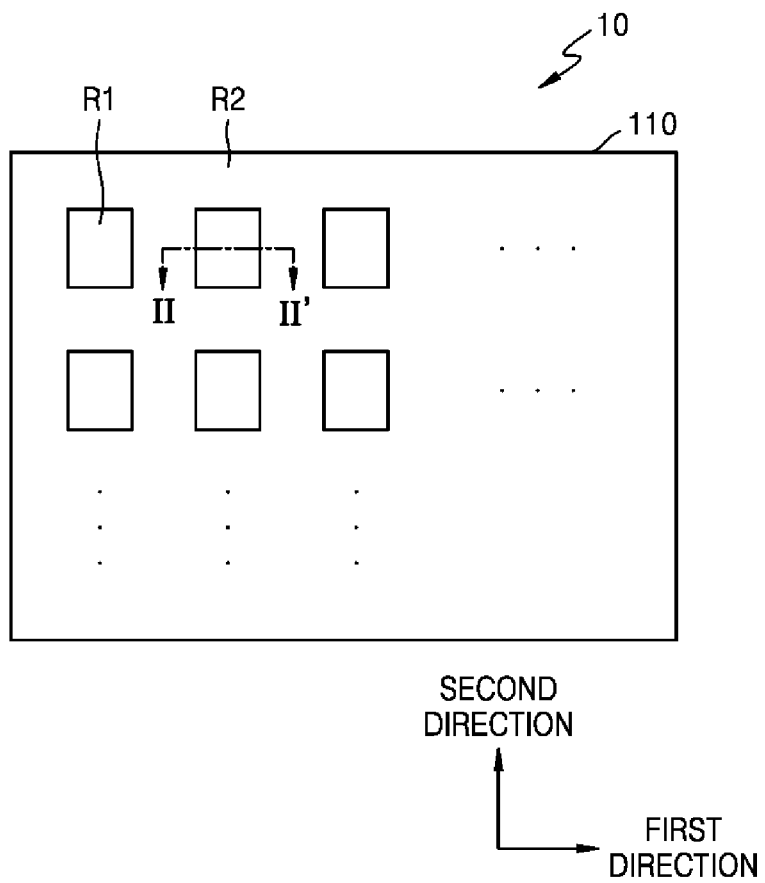
FIG. 1B is a schematic plan view of the display of FIG. 1A according to an embodiment.

FIG. 1A is a perspective view of a display 10 according to an embodiment; FIG. 1B is a schematic plan view of the display 10 according to an embodiment; and FIG. 1C is a partial cross-sectional view taken along the line I-I' of the display 10 of FIG. 1A.

Figure 1C:
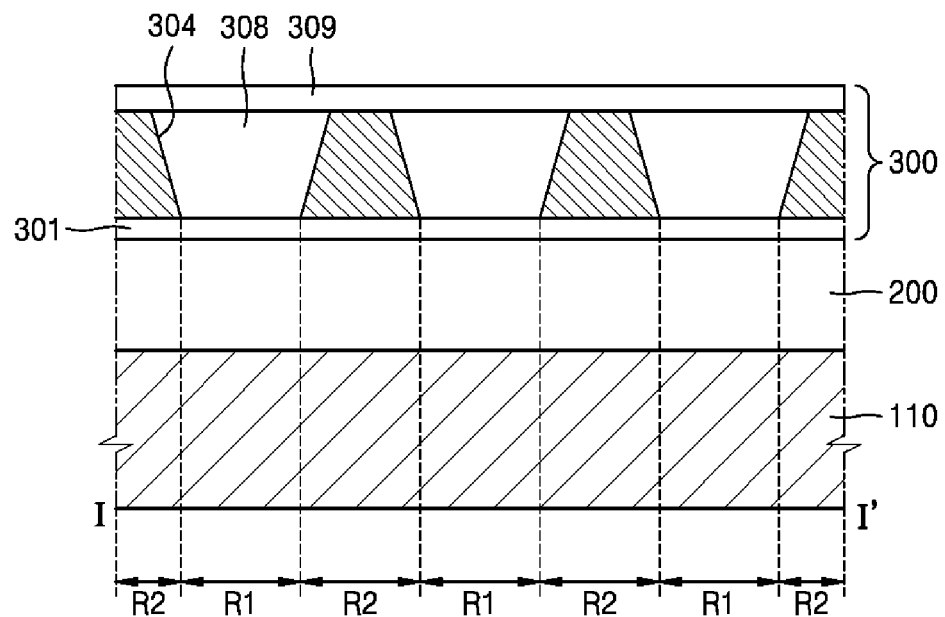
FIG. 1C is a partial cross-sectional view taken along the line I-I' of the display of FIG. 1A.

Referring to FIGS. 1A to 1C, the display 10 includes a substrate 110, a display unit 200 positioned on the substrate 110, and an encapsulation member 300 covering the display unit 200. The substrate 110, the display unit 200, and the encapsulation member 300 are sequentially stacked on one another in a third direction.

The display 10 may be a liquid crystal display (LCD), an organic light-emitting display (OLED), an electrophoretic display, an electrowetting display panel, or the like. An OLED will be described as an example.

In the display unit 200, a plurality of pixels may be arranged in a first direction and a second direction. Each of the pixels may include a display device, and a pixel circuit electrically connected to the display device. The display devices may be arranged on light-emission regions R1, and the pixel circuits may be arranged on the light-emission regions R1 or a non-light-emission region R2 around the light-emission regions R1. The light-emission regions R1 may be defined as regions corresponding to first electrodes or emission layers of the display devices.

Although the light-emission regions R1 are shown having a quadrilateral shape in FIG. 1B, embodiments are not limited thereto. Each of the light-emission regions R1 may have any of various shapes, such as a polygon, a rectangle, a circle, a cone, an oval, and a triangle.

The encapsulation member 300 may perform a function of encapsulating the display unit 200, and a color conversion function. The encapsulation member 300 may include color conversion members 308 arranged on the light-emission regions R1, a light-shielding member 304 arranged on the non-light-emission region R2, and a second protection layer 309.

Although not shown in the drawings, on the encapsulation member 300, a window may be coupled to the encapsulation member 300 via a pressure sensitive adhesive (PSA). The display 10 may provide an encapsulation function, and a brightness enhancing function based on reflectance control, by using the encapsulation member 300 without using special optical members.

An optical member, such as a polarization film or a phase difference film, may reduce the luminescent efficiency of a display by refracting or reflecting internal light emitted by display devices. The display 10 may improve luminescent efficiency by omitting an optical member and also may reduce reflectance of external light by including the color conversion members 308. Thus, the display 10 may have improved visibility.

Because an optical member is generally provided in the form of a film, the optical member has a thickness equal to or greater than a certain thickness. Moreover, an adhesion layer may be additionally needed to apply an optical film to a display. Accordingly, a display including an encapsulation layer and a special optical film may thicken and thus may influence flexibility of the display. In the display 10, the color conversion members 308 may be arranged directly on the substrate 110 and thus provide both an encapsulation function and a function of an optical member. This may reduce the thickness of the display 10. Accordingly, a thin display may be realized, and a flexible (foldable or rollable) display may be easily realized.

Figure 2A:
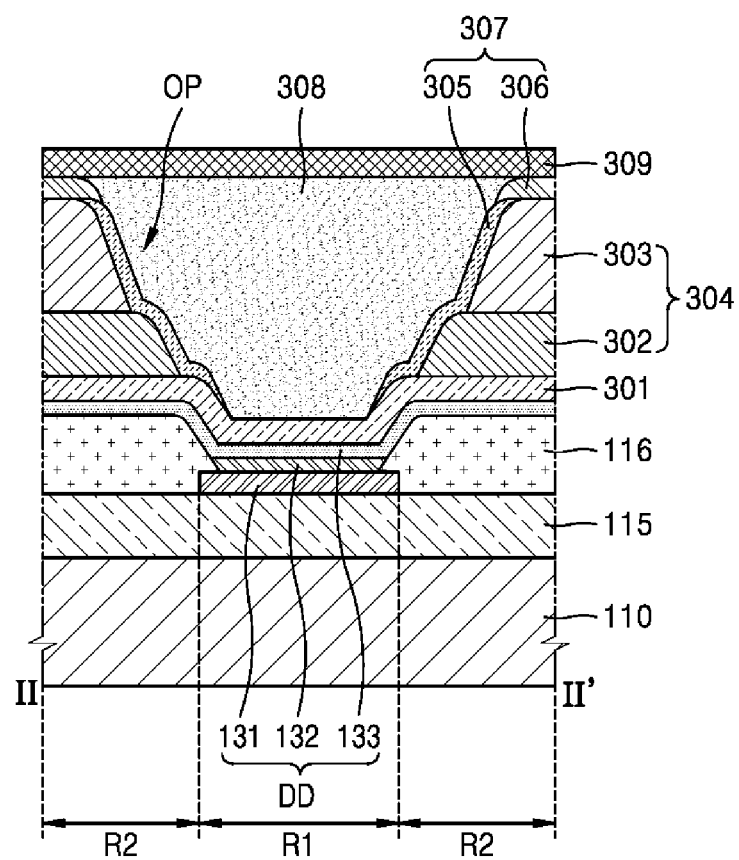
FIG. 2A is a partial cross-sectional view taken along the line II-II' of the display of FIG. 1B.

FIG. 2A is a partial cross-sectional view taken along the line II-II' of FIG. 1B of the display 10.

Referring to FIG. 2A, the display 10 may include the display unit 200 having pixels arranged on the substrate 110, and the encapsulation member 300 on the display unit 200. Each of the pixels may include a display device DD arranged on a light-emission region R1, and a pixel circuit (not shown) electrically connected to the display device DD.

The display device DD may include a first electrode 131, a second electrode 133 opposite to the first electrode 131, and an intermediate layer 132 between the first electrode 131 and the second electrode 133. Although not shown in FIG. 2A, the first electrode 131 may be electrically connected to a pixel circuit below the first electrode 131.

The encapsulation member 300 may include a first protection layer 301, the light-shielding member 304, the color conversion members 308, and the second protection layer 309. The color conversion members 308 may overlap the light-emission regions R1, and the light-shielding member 304 may overlap the non-light-emission region R2.

The first protection layer 301 may cover the display devices DD and may be disposed on the light-emission regions R1 and the non-light-emission region R2. In an embodiment, the first protection layer 301 may include at least one inorganic film. In an embodiment, the first protection layer 301 may be omitted.

The light-shielding member 304 may be arranged directly on the first protection layer 301 and thus may contact an upper surface of the first protection layer 301. In an embodiment, when the first protection layer 301 is omitted, the light-shielding member 304 may be arranged directly on the second electrode 133 and thus may contact an upper surface of the second electrode 133. The light-shielding member 304 may include a first light-shielding layer 302 and a second light-shielding layer 303. The first light-shielding layer 302 and the second light-shielding layer 303 may be stepped.

Figure 2B:
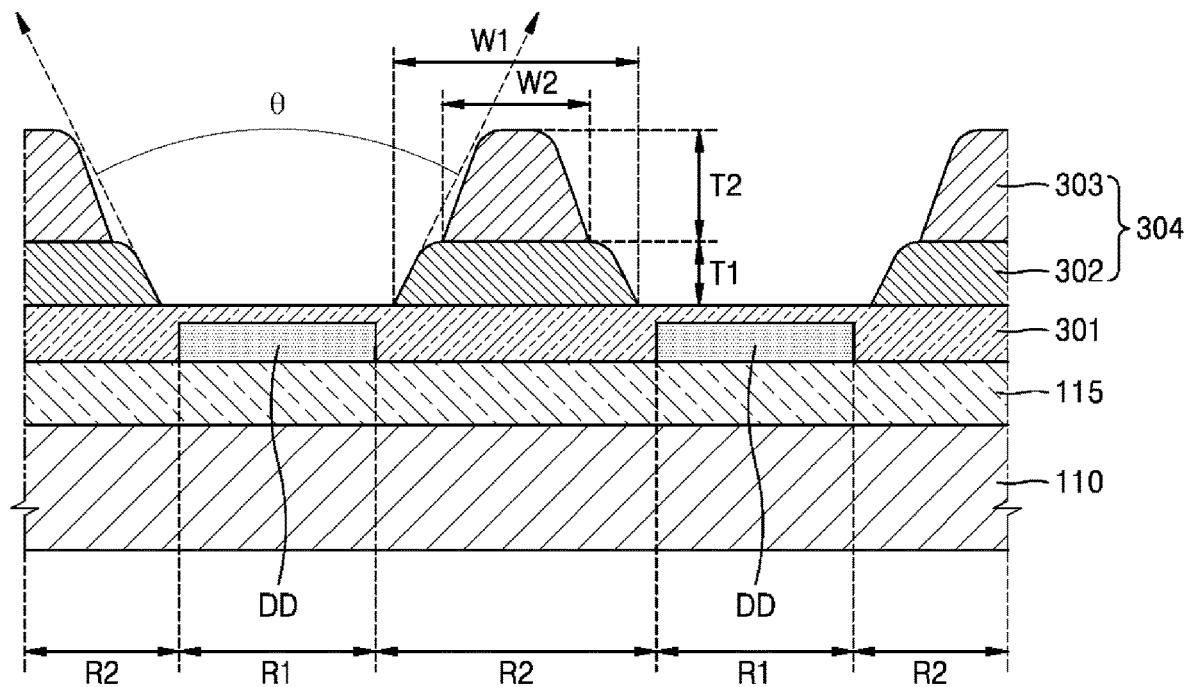
FIG. 2B is a partial cross-sectional view for explaining a light-shielding member, according to an embodiment.

FIG. 2B is a partial cross-sectional view for explaining the light-shielding member 304, according to an embodiment.

Referring to FIG. 2B, the first light-shielding layer 302 may have a first thickness T1 and a first width W1 and may be disposed on the non-light-emission region R2. The second light-shielding layer 303 may have a second thickness T2 and a second width W2 and may be disposed on the non-light-emission region R2. The second thickness T2 may be greater than the first thickness T1. The first width W1 may be greater than the second width W2. The second light-shielding layer 303 may be disposed on the first light-shielding layer 302 and may be formed to be retreated from an edge of the first light-shielding layer 302.

The first width W1 of the first light-shielding layer 302 may be a width of a bottom surface of the first light-shielding layer 302, and a lateral surface of the first light-shielding layer 302 may be inclined with respect to the bottom surface thereof. The second width W2 of the second light-shielding layer 303 may be a width of a bottom surface of the second light-shielding layer 303, and a lateral surface of the second light-shielding layer 303 may be inclined with respect to the bottom surface thereof.

The first thickness T1 and the first width W1 of the first light-shielding layer 302 may be determined such that a viewing angle (θ) relative to a luminance ratio may be secured. The second thickness T2 of the second light-shielding layer 303 may be determined such that color mixing of light beams produced from neighboring light-emission regions R1 may be prevented or substantially prevented. The second width W2 may be determined such that the viewing angle (θ) relative to the luminance ratio may be secured based on the first width W1.

The first light-shielding layer 302 and the second light-shielding layer 303 may include a material that absorbs at least a portion of light, a light reflection material, or a light scattering material. In an embodiment, the first light-shielding layer 302 and the second light-shielding layer 303 may include an opaque material, such as including an organic resin, a resin or paste including glass paste and a black pigment, metal particles (e.g., any of nickel, aluminum, molybdenum, and an alloy thereof), metal oxide particles (for example, chromium oxide), or metal nitride particles (for example, chromium nitride).

In an embodiment, the first light-shielding layer 302 may include a low-reflection inorganic material. In an embodiment, the second light-shielding layer 303 may include a low-reflection organic material.

The color conversion members 308 may be disposed within openings OP defined by the light-shielding member 304 and thus may fill the openings OP. In an embodiment, the light-shielding members 308 may be disposed directly on the first protection layer 301 within the openings OP and thus may contact the upper surface of the first protection layer 301.

The color conversion members 308 may be color filters having different colors corresponding to the respective pixels of the light-emission regions R1. For example, the color conversion members 308 may include red, green, and blue color filters. According to another embodiment, the color conversion members 308 may include color filters having four or more colors. The color conversion members 308 may include a low-reflection and low-temperature color filter material. In an embodiment, the color conversion members 308 may include a pigment of 40% or more within a solid.

In an embodiment, a liquid repellent pattern 307 may be included between the light-shielding member 304 and the color conversion members 308. The liquid repellent pattern 307 may include a first liquid repellent pattern 305 and a second liquid repellent pattern 306.

The first liquid repellent pattern 305 may be formed along lateral surfaces of the openings OP. The first liquid repellent pattern 305 may cover a portion of the first protection layer 301, a lateral surface of the first light-shielding layer 302, and a lateral surface of the second light-shielding layer 303. The first liquid repellent pattern 305 has an affinity with the color conversion members 308 and thus may have a hydrophilic property to prevent or substantially prevent the color conversion members 308 from not completely filling the openings OP. In an embodiment, the first liquid repellent pattern 305 may include polyacrylamide photo resist, polyethylenimine photo resist, or the like.

The second liquid repellent pattern 306 may cover an upper surface of the second light-shielding layer 303. The second liquid repellent pattern 306 may have a hydrophobic property in order to prevent or substantially prevent color conversion members 308 of neighboring light-emission regions R1 from mixing with each other. In an embodiment, the second liquid repellent pattern 306 may include a fluorinated silane promoter, a fluorinated acryl monomer, a fluorinated alkyl photo resist, or the like.

The second protection layer 309 is disposed on the color conversion members 308 and protects the color conversion members 308. The second protection layer 309 may cover the light-emission regions R1 and the non-light-emission region R2 and may be disposed on the upper surface of the second light-shielding layer 303 and upper surfaces of the color conversion members 308. In an embodiment, the second protection layer 309 may include at least one inorganic film. In an embodiment, the second protection layer 309 may be omitted.

FIGS. 3 through 10 are cross-sectional views schematically illustrating a method of manufacturing a display, according to an embodiment.

Figure 3:
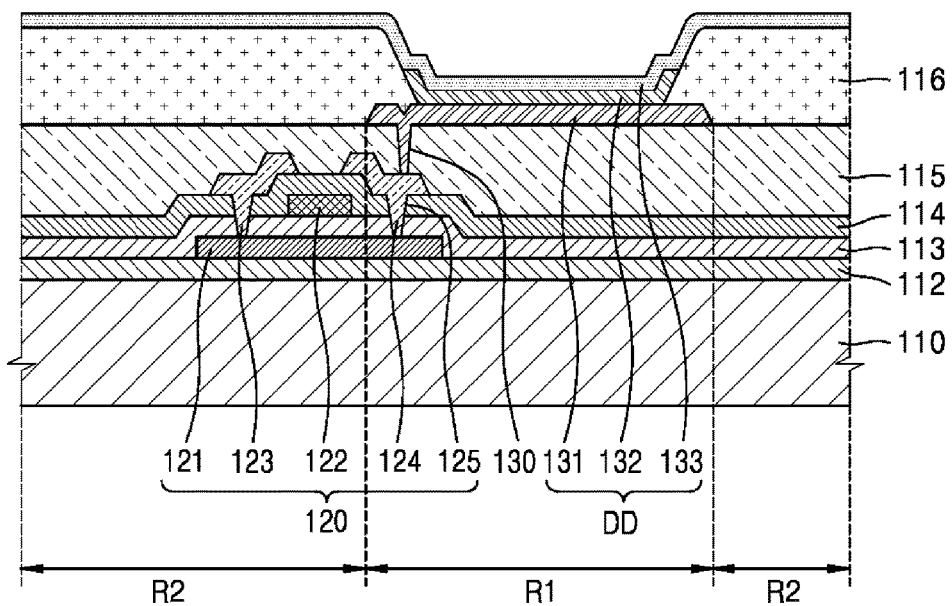
FIGS. 3 through 10 are cross-sectional views schematically illustrating a method of manufacturing a display, according to an embodiment.

Referring to FIG. 3, a plurality of pixels may be formed on a substrate 110. Each of the pixels may include a display device DD, and a pixel circuit including a thin film transistor (TFT) 120 electrically connected to the display device DD. The display device DD may be formed on a light-emission region R1, and the pixel circuit may be formed on a non-light-emission region R2. The display device DD may be an organic light-emitting diode (OLED).

A buffer layer 112 may be formed on the substrate 110, and then a semiconductor layer may be formed and patterned on the buffer layer 112 to thereby form an active layer 121 of the TFT 120.

The substrate 110 may be formed of any of various materials, such as glass, plastic, or metal. According to an embodiment, the substrate 110 may include a flexible substrate.

The buffer layer 112 may be formed of at least one of an organic layer and an inorganic layer. For example, the buffer layer 112 may perform functions of blocking impurity elements from being permeated through the substrate 110, and planarizing the surface of the substrate 110, and may be formed of an inorganic material, such as silicon nitride (SiNx) and/or silicon oxide (SiOx), and as a single layer or multiple layers. In an embodiment, the buffer layer 112 may be omitted.

The semiconductor layer may include any of various materials. For example, the semiconductor layer may include an inorganic semiconductor material, such as amorphous silicon or crystalline silicon. As another example, the semiconductor layer may contain an oxide semiconductor or an organic semiconductor material.

Thereafter, a first insulating layer 113 may be formed on the active layer 121, and then a first conductive layer may be formed and patterned on the first insulating layer 113 to thereby form a gate electrode 122.

In an embodiment, the first insulating layer 113 may be an inorganic insulation layer. In an embodiment, the first insulating layer 113 may be formed of at least one insulating material selected from $SiO_2$, $SiN_x$, SiON, $Al_2O_3$, $TiO_2$, $Ta_2O_5$, $HfO_2$, $ZrO_2$, BST, and PZT, in a single-layered or multi-layered structure.

The first conductive layer may be formed of any of various conductive materials. In an embodiment, the first conductive layer may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), in a single-layered or multi-layered structure.

A second insulating layer 114 may be formed on the gate electrode 122 and then patterned to thereby form contact holes 125 respectively exposing portions of a source region and a drain region of the active layer 121.

In an embodiment, the second insulating layer 114 may be an inorganic insulation layer. In an embodiment, the second insulating layer 114 may be formed of at least one insulating material selected from $SiO_2$, $SiN_x$, SiON, $Al_2O_3$, $TiO_2$, $Ta_2O_5$, $HfO_2$, $ZrO_2$, BST, and PZT, in a single-layered or multi-layered structure. According to another embodiment, the second insulating layer 114 may be an organic insulation layer.

A second conductive layer may be formed on the second insulating layer 114 and then patterned to thereby form a source electrode 123 and a drain electrode 124 that respectively contact the source region and the drain region of the active layer 121.

In an embodiment, the second conductive layer may be formed of a same material as a material used to form the first conductive layer, and as a single layer or multiple layers. For example, the second conductive layer may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu).

A third insulating layer 115 may be formed on the source electrode 123 and the drain electrode 124 and then patterned to thereby form a via hole 130 through which a portion of one of the source electrode 123 and the drain electrode 124 is exposed.

In an embodiment, the third insulating layer 115 may be formed of an organic insulating material, and as a single layer or multiple layers. In an embodiment, the third insulating layer 115 may include a commercial polymer such as polymethyl methacrylate (PMMA) or polystyrene (PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. For example, the third insulating layer 115 may include polyimide, polyamide (PA), acryl resin, or the like.

An OLED electrically connected to the TFT 120 may be formed on the third insulating layer 115.

A first electrode 131 may be formed by forming and patterning a third conductive layer on the third insulating layer 115, and may be electrically connected to one of the source electrode 123 and the drain electrode 124 through the via hole 130.

In an embodiment, the third conductive layer may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer.

A fourth insulating layer 116 exposing at least a portion of the first electrode 131 and covering an edge of the first electrodes 131 may be formed on the first electrode 131.

In an embodiment, the fourth insulating layer 116 may be formed of the aforementioned inorganic or organic insulating material, and as a single layer or multiple layers.

An intermediate layer 132 may be formed on the exposed portion of the first electrode 131, and a second electrode 133 opposite to the first electrode 131 may be formed on the intermediate layer 132.

In an embodiment, the intermediate layer 132 includes at least an emission layer (EML) and may further include a least one functional layer from among a hole injection layer (HIL), a hole transport layer (HTL), an electron transport layer (ETL), and an electron injection layer (EIL), in addition to the EML.

In an embodiment, the EML may be a red emission layer, a green emission layer, or a blue emission layer. Alternatively, to emit white light, the EML may have a multi-layered structure in which a red emission layer, a green emission layer, and a blue emission layer are stacked, or may have a single-layered structure including a red emission material, a green emission material, and a blue emission material.

Although the intermediate layer 132 is shown patterned to correspond to only the first electrode 131 in FIG. 3, this illustration is for convenience of explanation, and the intermediate layer 132 may be integrally formed with an intermediate layer 132 of a display device DD of an adjacent light-emission region R1. Alternatively, at least one layer of the intermediate layer 132 may be formed for each light-emission region R1 and at least one other layer thereof may be integrally formed with the intermediate layer 132 of the adjacent light-emission region R1. In this way, various modifications may be made.

In an embodiment, the second electrode 133 may include a layer formed of a material selected from the group consisting of lithium (Li), calcium (Ca), lithium fluoride/calcium (LiF/Ca), lithium fluoride/aluminum (LiF/Al), aluminum (Al), magnesium (Mg), and a compound thereof, and may also include, on the layer, an auxiliary electrode or bus electrode line formed of a transparent electrode forming material selected from the group consisting of ITO, IZO, ZnO, and $In_2O_3$. In an embodiment, the second electrode 133 may be formed on an entire surface of the display unit 200 including the light-emission regions R1 and the non-light-emission region R2.

The display device DD may be disposed such as not to overlap the TFT 120 or may be disposed such as to partially overlap the TFT 120.

Figure 4:
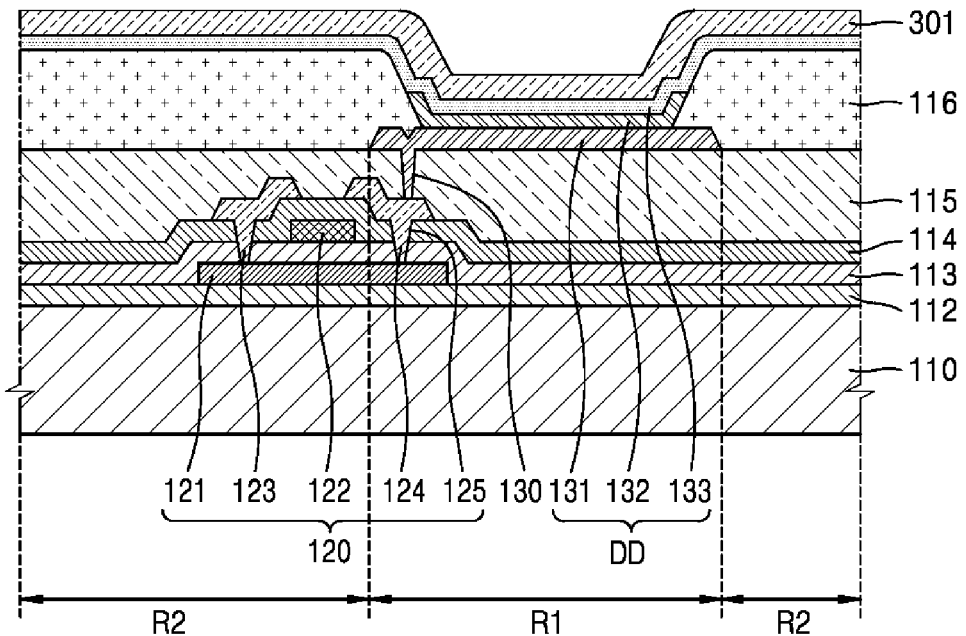

Referring to FIG. 4, a first protection layer 301 may be formed on the second electrode 133.

In an embodiment, the first protection layer 301 may include at least one inorganic film. In an embodiment, the first protection layer 301 may be formed on the second electrode 133 by chemical vapor deposition (CVD) or atomic layer deposition (ALD).

Figure 5:
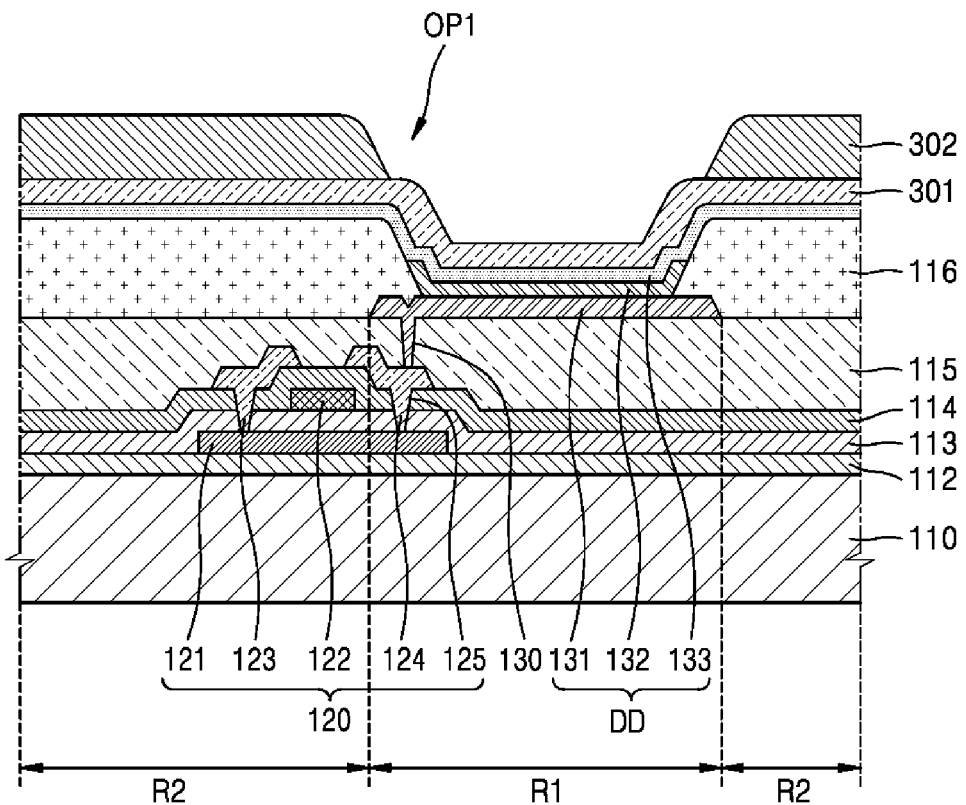

Referring to FIG. 5, a first light-shielding layer 302 may be formed on the first protection layer 301 in the non-light-emission region R2.

In an embodiment, a photosensitive layer may be formed by coating an upper surface of the first protection layer 301 with a first light-shielding material, and then may undergo photolithography to thereby form the first light-shielding layer 302 having a first opening OP1. The first opening OP1 may correspond to a light-emission region R1 and may expose a portion of the first protection layer 301 (for example, a portion of the first protection layer 301 that corresponds to the light-emission region R1).

The first opening OP1 may be formed to be larger than an opening through which the first electrode 131 formed on the fourth insulating layer 116 is exposed, and, thus, the first light-shielding layer 302 may be formed to be retreated from an edge of the fourth insulating layer 116 on the side of the light-emission region R1.

In an embodiment, the first light-shielding layer 302 may include an inorganic insulating material, such as inorganic oxide or inorganic nitride (for example, SiOx, SiNx, SiNxOy, AlOx, TiOx, TaOx, ZnOx, or MoTaOx).

In an embodiment, the first light-shielding layer 302 may be formed to be about 200 Å to about 1.0 μm.

Figure 6:
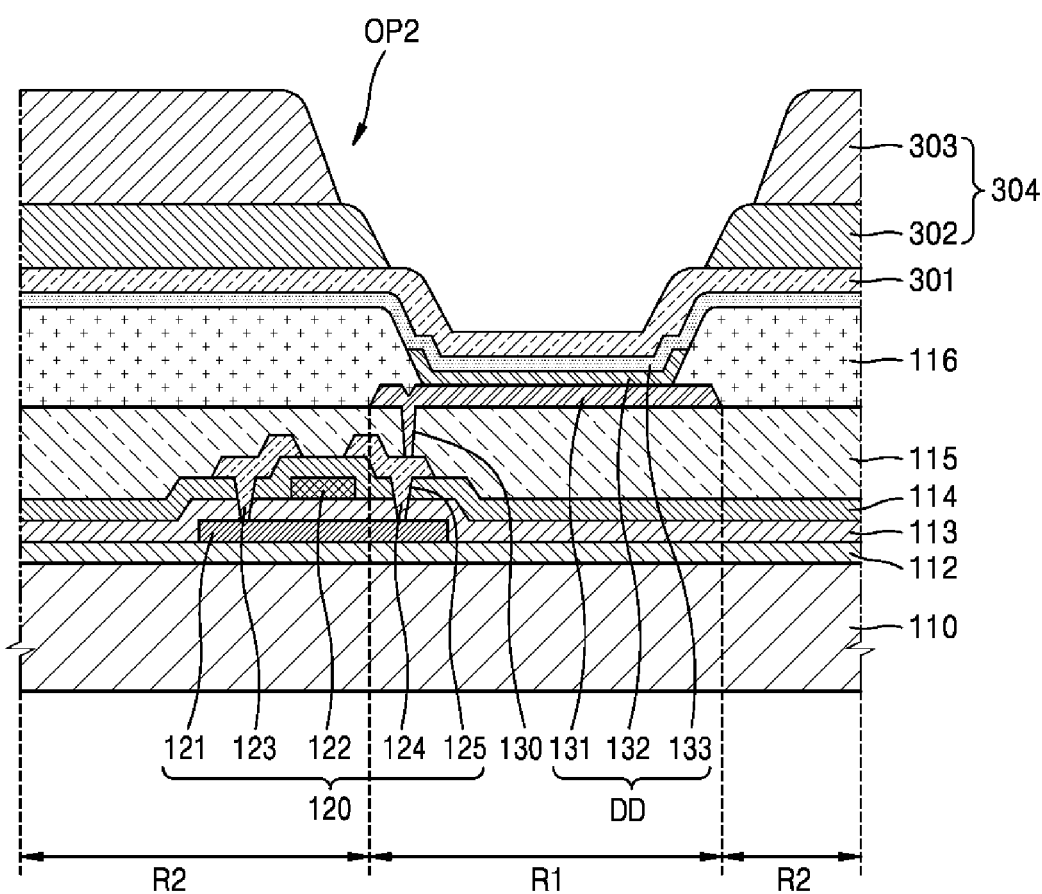

Referring to FIG. 6, a second light-shielding layer 303 may be formed on the first light-shielding layer 302.

In an embodiment, a photosensitive layer may be formed by coating the entire surface of the substrate 110 with a second light-shielding material, and then may undergo photolithography to thereby form the second light-shielding layer 303 having a second opening OP2. The second opening OP2 may be formed to be larger than the first opening OP1 by corresponding to the light-emission region R1 and a portion of the non-light-emission region R2, and may expose a portion of the first protection layer 301 (for example, a portion of the first protection layer 301 that corresponds to the light-emission region R1) and an edge of the first light-shielding layer 302 on the side of the light-emission region R1. Accordingly, the second light-shielding layer 303 may be formed to be retreated from the edge of the first light-shielding layer 302 on the side of the light-emission region R1.

In an embodiment, the second light-shielding layer 303 may be formed of an organic insulating material, such as a thermoplastic resin (e.g., PC, polyethylene terephthalate (PET), polyether sulfone, polyvinyl butyral, polyphenylene ether, polyamide, polyetherimide, norbornene-based resin, methacrylic resin, or cyclic polyolefin series), or a thermosetting resin (e.g., epoxy resin, phenol resin, urethane resin, acrylic resin, vinyl ester resin, imide resin, urethane system resin, urea resin, or melamine resin).

A thickness of the second light-shielding layer 303 may be determined to be a certain height or greater, in consideration of process characteristics and material characteristics of the color conversion members 308, which are to be formed next. In an embodiment, the second light-shielding layer 303 may be formed to be about 4.0 μm to about 5.0 μm.

Although the first light-shielding layer 302 and the second light-shielding layer 303 are shown sequentially formed in the embodiment of FIGS. 5 and 6, embodiments are not limited thereto. For example, a first light-shielding material and a second light-shielding material may be sequentially stacked and then patterned to thereby form the first light-shielding layer 302 having the first opening OP1 and the second light-shielding layer 303 having the second opening OP2.

Figure 7:
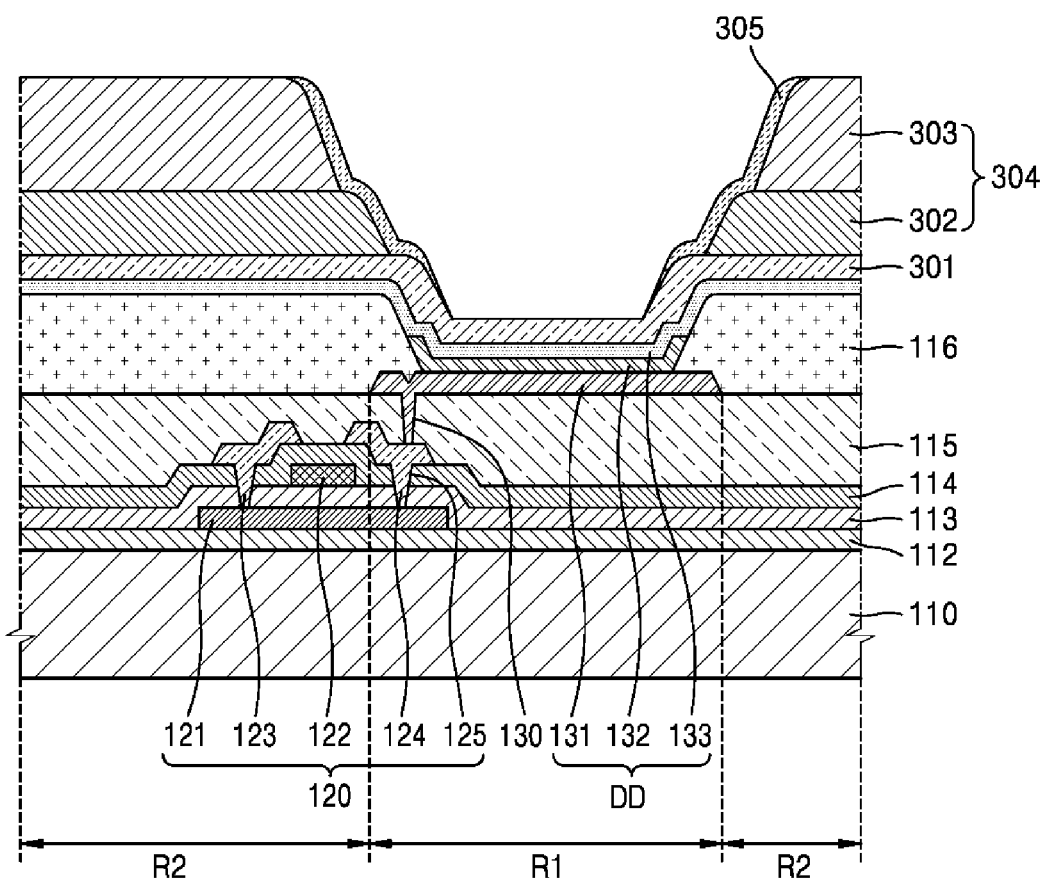

Referring to FIG. 7, a first liquid repellant pattern 305 may be formed on the lateral surface of the light-shielding member 304.

A liquid repellent material having a hydrophilic property may be coated on the substrate 110 on which the light-shielding member 304 has been formed, and then may be patterned such as to remain only on respective lateral surfaces of the first opening OP1 and the second opening OP2. Thus, the first liquid repellent pattern 305 may be formed.

The first liquid repellent pattern 305 may be formed on the lateral surface of the first protection layer 301 and the respective lateral surfaces of the first and second light-shielding layers 302 and 303, which are exposed through the first opening OP1 and the second opening OP2.

Figure 8:
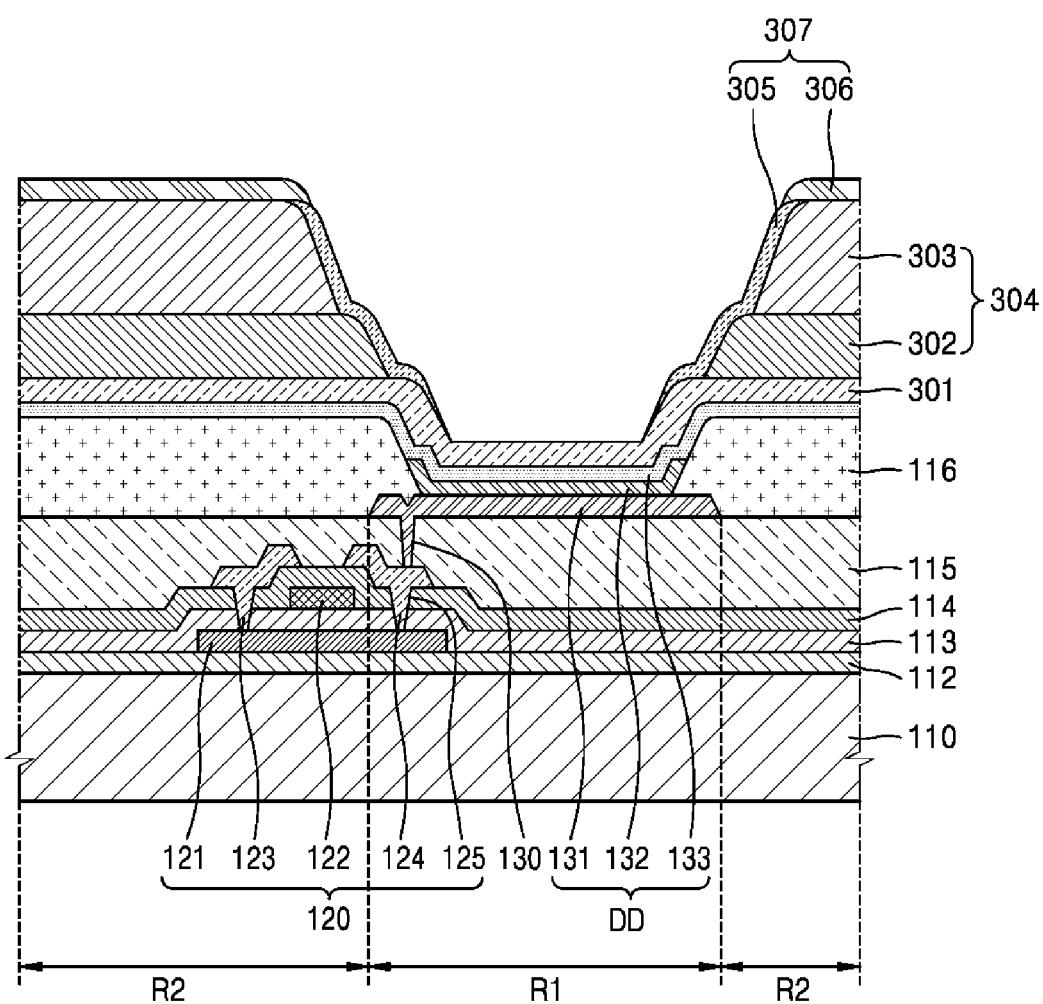

Referring to FIG. 8, a second liquid repellant pattern 306 may be formed on an upper surface of the light-shielding member 304.

A liquid repellent material having a hydrophobic property may be coated on the substrate 110 on which the light-shielding member 304 and the first liquid repellent pattern 305 have been formed, and then may be patterned such as to remain only on the upper surface of the light-shielding member 304, namely, the upper surface of the second light-shielding layer 303. Thus, the second liquid repellent pattern 306 may be formed.

Figure 9:
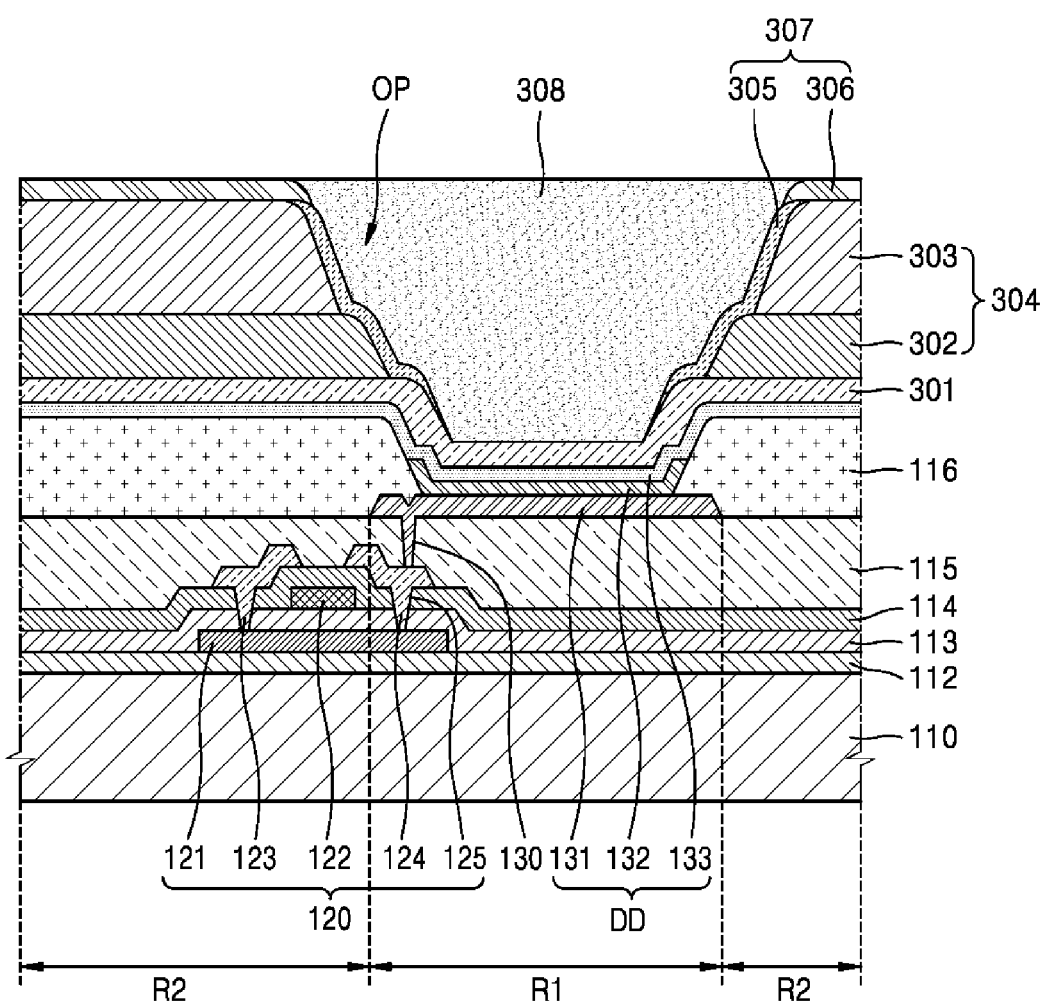

Referring to FIG. 9, each color conversion member 308 may be formed within an opening OP on which the liquid repellent pattern 307 has been formed (i.e. the first opening OP1 and the second opening OP2).

In an embodiment, the color conversion member 308 may be formed via a solution process, such as dropping or ink-jetting. When ink-jetting is used, the color conversion member 308 may be formed by discharging a color ink including a color conversion material into the opening OP of the light-emission region R1 and then hardening the color ink. The light-shielding member 304 may serve as a dam that confines the color ink.

A color conversion material corresponding to the color of the display device DD formed in the light-emission region R1 may be provided to the opening OP. In an embodiment, a hardening process may be an ultraviolet (UV) ray hardening process or a heat curing process, or the UV hardening process and the heat curing process may be concurrently (e.g., simultaneously) conducted. In this case, the heat curing process may be a low-temperature curing process of 90° or less. Accordingly, during the hardening process, damage to the display device DD may be prevented or substantially prevented, and stability of a process may be improved.

According to an embodiment, the color conversion member 308 is formed via ink-jetting, which is different from photolithography. Accordingly, a mask for forming the color conversion member 308 via photolithography is not needed, and a pre-baking process that is conducted at a high temperature required by photolithography or a developing process exposed to a developing solution, and a subsequent post-baking process may be omitted.

Figure 10:
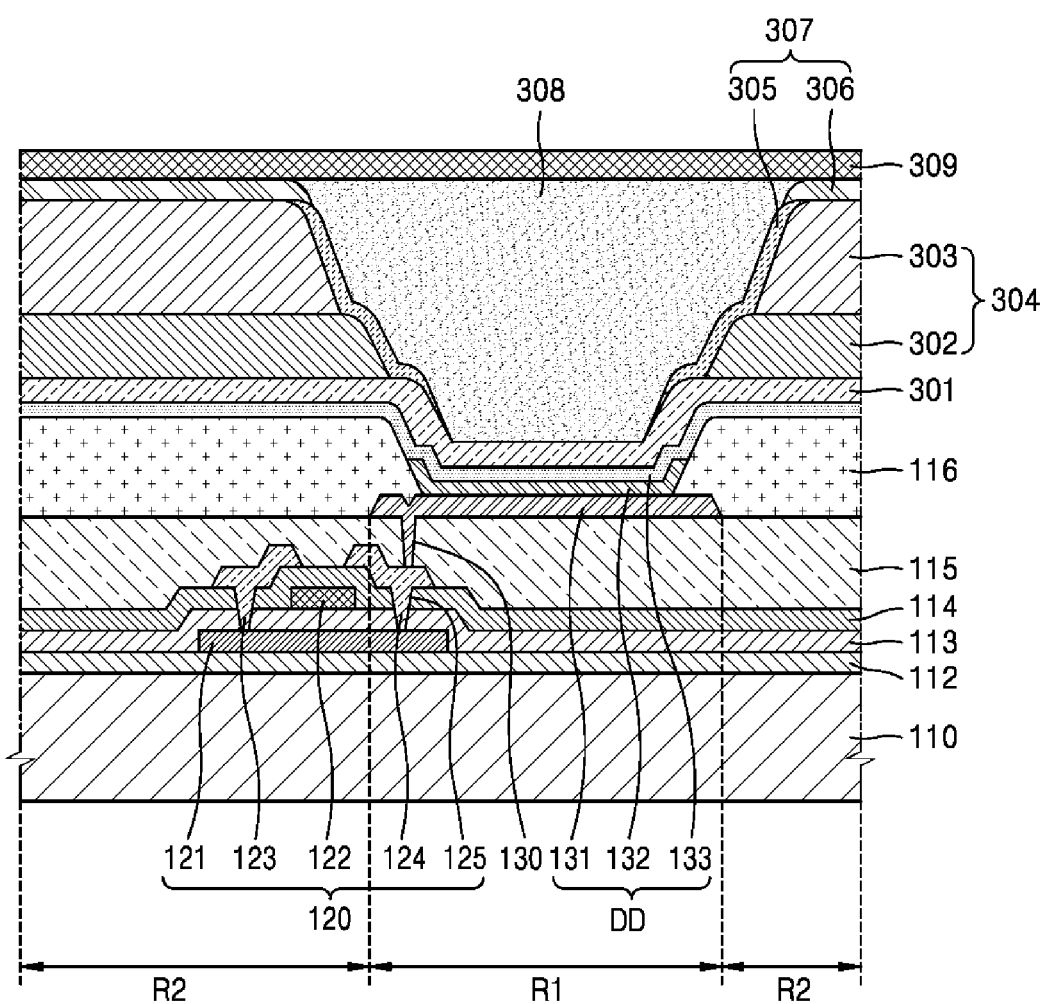

Referring to FIG. 10, a second protection layer 309 may be formed on the substrate 110 on which the color conversion members 308 have been formed.

In an embodiment, the second protection layer 309 may include at least one inorganic film. In an embodiment, the second protection layer 309 may be formed on the light-shielding member 304 and the color conversion members 308 by CVD or ALD.

In the above-described embodiment, a liquid repellent material is coated on a surface of the light-shielding member 304. However, according to another embodiment, the light-shielding member 304 may undergo plasma surface treatment, instead of being coated with the liquid repellent material, to thereby improve adhesion with a color solution during formation of the color conversion members 308, thus stably forming the color conversion members 308.

One or more embodiments include a display having a reduced thickness and providing improved luminescent efficiency.

It is to be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as set forth by the following claims.

What is claimed is:

1. A display comprising:
   a substrate comprising a light-emission region and a non-light-emission region around the light-emission region;
   a display device on the light-emission region of the substrate; and
   an encapsulation member on the display device,
   wherein the encapsulation member comprises:
   a light-shielding member comprising a first light-shielding layer and a second light-shielding layer, the first light-shielding layer being in a region corresponding to the non-light-emission region, and the second light-shielding layer being on the first light-shielding layer; and
   a color conversion member in a region corresponding to the light-emission region, and
   wherein the second light-shielding layer is located outside an opening formed in the first light-shielding layer, the opening corresponding to the light-emission region.

2. The display of claim 1, wherein the encapsulation member further comprises a first protection layer between the display device and the light-shielding member.

3. The display of claim 2, wherein the first protection layer comprises an inorganic material.

4. A display comprising:
   a substrate comprising a light-emission region and a non-light-emission region around the light-emission region;
   a display device on the light-emission region of the substrate;
   an encapsulation member on the display device;
   a first liquid repellent pattern between the light-shielding member and the color conversion member; and
   a second liquid repellent pattern on the second light-shielding layer,
   wherein the encapsulation member comprises:
   a light-shielding member comprising a first light-shielding layer and a second light-shielding layer, the first light-shielding layer being in a region corresponding to the non-light-emission region, and the second light-shielding layer being on the first light-shielding layer; and a color conversion member in a region corresponding to the light-emission region.

5. The display of claim 4, wherein
the first liquid repellent pattern comprises a hydrophilic material, and
the second liquid repellent pattern comprises a hydrophobic material.

6. The display of claim 1, further comprising a second protection layer on the light-shielding member and the color conversion member.

7. The display of claim 6, wherein the second protection layer comprises an inorganic material.

8. The display of claim 1, wherein
a width of the first light-shielding layer is greater than a width of the second light-shielding layer, and
a thickness of the second light-shielding layer is greater than a thickness of the first light-shielding layer.

9. A display comprising:
a substrate;
a first electrode on the substrate;
a first insulating layer covering an edge of the first electrode;
an intermediate layer on the first electrode and comprising an emission layer;
a second electrode covering the intermediate layer and facing the first electrode;
a second insulating layer covering the second electrode;
a light-shielding member comprising a first light-shielding layer and a second light-shielding layer, the first light-shielding layer being on the second insulating layer and having a first opening through which a portion of the second insulating layer corresponding to the emission layer is exposed, and the second light-shielding layer being on the first light-shielding layer and having a second opening through which the first opening and an edge of the first light-shielding layer are exposed; and
a color conversion member within the first and second openings.

10. The display of claim 9, further comprising:
a first liquid repellent pattern on respective lateral surfaces of the first and second openings; and
a second liquid repellent pattern on the second light-shielding layer.

11. The display of claim 10, wherein
the first liquid repellent pattern comprises a hydrophilic material, and
the second liquid repellent pattern comprises a hydrophobic material.

12. The display of claim 9, further comprising a third insulating layer on the light-shielding member and the color conversion member.

13. The display of claim 12, wherein the third insulating layer comprises an inorganic material.

14. The display of claim 9, wherein
a width of the first light-shielding layer is greater than a width of the second light-shielding layer, and
a thickness of the second light-shielding layer is greater than a thickness of the first light-shielding layer.

15. A method of manufacturing a display, the method comprising:
providing a substrate comprising a light-emission region and a non-light-emission region around the light-emission region;
forming a display device on the light-emission region of the substrate;
forming a light-shielding member on the display device, the light-shielding member comprising a first light-shielding layer and a second light-shielding layer, wherein the first light-shielding layer is in a region corresponding to the non-light-emission region, and the second light-shielding layer is on the first light-shielding layer; and
forming a color conversion member in a region corresponding to the light-emission region, wherein the color conversion member is formed on the first light-shielding layer,
wherein the second light-shielding layer is located outside an opening formed in the first light-shielding layer, the opening corresponding to the light-emission region.

16. The method of claim 15, further comprising, after the forming of the light-shielding member:
forming a first liquid repellent pattern on respective lateral surfaces of the first and second light-shielding layers; and
forming a second liquid repellent pattern on the second light-shielding layer.

17. The method of claim 15, wherein the forming of the light-shielding member comprises:
forming the first light-shielding layer on the display device, the first light-shielding layer comprising the opening through which a portion of the display device corresponding to the light-emission region is exposed; and
forming the second light-shielding layer outside the opening of the first light-shielding layer, the second light-shielding layer comprising another opening through which an edge of the first light-shielding layer is exposed.

18. The method of claim 15, further comprising forming a second protection layer on the light-shielding member and the color conversion member.

19. The method of claim 15, wherein
a width of the first light-shielding layer is greater than a width of the second light-shielding layer, and
a thickness of the second light-shielding layer is greater than a thickness of the first light-shielding layer.

20. The method of claim 15, further comprising forming a first protection layer covering the display device, and wherein the forming of the light-shielding member comprises forming the first light-shielding layer on the first protection layer.

* * * * *